(12) United States Patent
Liu

(10) Patent No.: US 12,300,308 B2
(45) Date of Patent: May 13, 2025

(54) DATA TRANSMISSION CIRCUIT, METHOD AND SEMICONDUCTOR MEMORY

(71) Applicant: CHANGXIN MEMORY TECHNOLOGIES, INC., Hefei (CN)

(72) Inventor: Zhonglai Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 380 days.

(21) Appl. No.: 17/864,660

(22) Filed: Jul. 14, 2022

(65) Prior Publication Data

US 2023/0343387 A1 Oct. 26, 2023

(30) Foreign Application Priority Data

Apr. 25, 2022 (CN) .......................... 202210493390.5

(51) Int. Cl.
*G11C 11/4096* (2006.01)
*G11C 7/10* (2006.01)
*G11C 7/22* (2006.01)

(52) U.S. Cl.
CPC ............ *G11C 11/4096* (2013.01); *G11C 7/10* (2013.01); *G11C 7/1039* (2013.01); *G11C 7/1069* (2013.01); *G11C 7/109* (2013.01); *G11C 7/22* (2013.01)

(58) Field of Classification Search
CPC ..... G11C 11/4096; G11C 7/10; G11C 7/1039; G11C 7/1069; G11C 7/109; G11C 7/22; G11C 5/147; G11C 2207/2227; G11C 7/1066; G11C 7/1006
See application file for complete search history.

(56) References Cited

U.S. PATENT DOCUMENTS

| 10,586,599 | B1 * | 3/2020 | Kubota | .................... G11C 5/06 |
| 2014/0032812 | A1 * | 1/2014 | Ong | .................... G11C 13/0007 711/102 |
| 2014/0210523 | A1 | 7/2014 | Geng | |
| 2020/0202959 | A1 * | 6/2020 | Shiraishi | ............. H03F 3/45264 |
| 2020/0333825 | A1 * | 10/2020 | Javidi | ........................ G06F 1/06 |

FOREIGN PATENT DOCUMENTS

CN 103973267 A 8/2014

* cited by examiner

*Primary Examiner* — Donald H B Braswell
(74) *Attorney, Agent, or Firm* — Syncoda LLC; Feng Ma

(57) ABSTRACT

A data transmission circuit, a data transmission method and a semiconductor memory are provided. The data transmission circuit includes a control circuit and a processing circuit. The control circuit is configured to receive a first enable signal, and control the processing circuit to be in an operating state when the first enable signal is in an active state, and control the processing circuit to be in a non-operating state when the first enable signal is in a non-active state. The processing circuit is configured to receive an initial data signal and drive the initial data signal to obtain a target transmission signal when the processing circuit is in the operating state.

16 Claims, 8 Drawing Sheets

DATA TRANSMISSION CIRCUIT, METHOD AND SEMICONDUCTOR MEMORY

CROSS-REFERENCE TO RELEVANT APPLICATION

The disclosure claims priority to Chinese patent application No. 202210493390.5, filed on Apr. 25, 2022, the contents of which are hereby incorporated by reference in its entirety.

BACKGROUND

In a semiconductor chip, a data transmission circuit (e.g., a data readout drive circuit) may be applied to read data in a memory. In some scenarios, data stored in the memory is required to be transmitted to another circuit, e.g., the data is read from a storage unit in the memory and then transmitted to another data port, or further transmitted to another chip or memory controller. If the data transmission circuit is a data readout drive circuit, the data readout drive circuit may obtain the data stored in the memory, process the data and further output a signal representing the data.

SUMMARY

The disclosure relates to the technical field of semiconductors, in particular to a data transmission circuit, a data transmission method and a semiconductor memory.

The technical scheme of the disclosure is implemented as follows.

In a first aspect, an embodiment of the disclosure provides a data transmission circuit, including a control circuit and a processing circuit.

The control circuit is configured to receive a first enable signal, control the processing circuit to be in an operating state when the first enable signal is in an active state, and control the processing circuit to be in a non-operating state when the first enable signal is in a non-active state.

The processing circuit is configured to receive an initial data signal and drive the initial data signal to obtain a target transmission signal when the processing circuit is in the operating state.

In a second aspect, an embodiment of the disclosure provides a data transmission method, including the following operations.

A first enable signal is received.

A first switch unit is turned on to receive an initial data signal when the first enable signal is in an active state.

The initial data signal is driven to obtain a target transmission signal. The initial data signal is generated according to a data signal obtained by a data transmission circuit when the first enable signal is in an active state.

In a third aspect, an embodiment of the disclosure provides a semiconductor memory, including a data transmission circuit in any one of the first aspects.

The embodiments of the disclosure provide a data transmission circuit, a data transmission method, and a semiconductor memory. The data transmission circuit includes a control circuit and a processing circuit. The control circuit is configured to receive a first enable signal, and control the processing circuit to be in an operating state when the first enable signal is in an active state, and control the processing circuit to be in a non-operating state when the first enable signal is in a non-active state. The processing circuit is configured to receive an initial data signal and drive the initial data signal to obtain a target transmission signal when the processing circuit is in the operating state. Therefore, the operating state of the processing circuit is controlled through the first enable signal and the control circuit, so that the processing circuit is in the operating state merely when the first enable signal is in the active state, thereby reducing the leakage current generated by the data transmission circuit, saving power consumption, and further preventing excessive leakage current from damaging the circuit.

DETAILED DESCRIPTION

Figure 1:
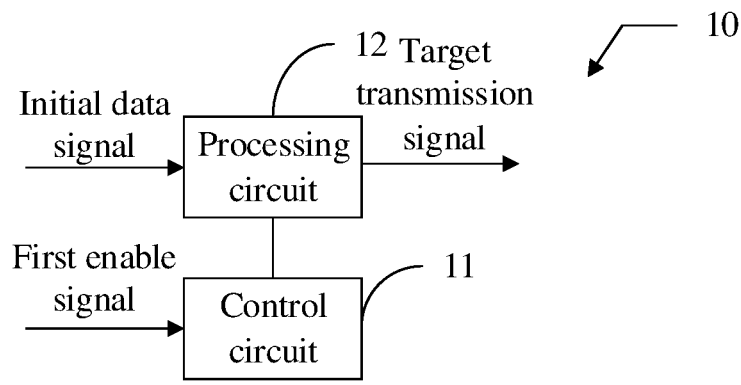
FIG. 1 illustrates a first schematic structural diagram of a data transmission circuit according to an embodiment of the disclosure.

The technical solutions in the embodiments of the present disclosure will be clearly and completely described below in conjunction with the accompanying drawings in the embodiments of the present disclosure. It is to be understood that the specific embodiments described herein are merely intended to explain the relevant application and not to limit the application. It should also be noted that, for ease of description, only portions related to the related application are illustrated in the accompanying drawings.

Unless otherwise defined, all technical and scientific terms used herein have the same meaning as those generally understood by those skilled in the art belonging to the present disclosure. The terms used herein are only adopted to describe the embodiments of the disclosure and not intended to limit the disclosure.

In the following description, "some embodiments" involved describes a subset of all possible embodiments, but it is to be understood that "some embodiments" may be a same subset or different subsets of all possible embodiments and may be combined with each other without conflict.

It should be noted that the term "first/second/third" involved in the following descriptions is only for distinguishing similar objects, and does not represent a specific sequence of the objects. It is to be understood that "first/second/third" may be interchanged to specific sequences or orders if allowed to implement the embodiments of the disclosure described herein in sequences except the illustrated or described ones Taking a data readout drive circuit as an example, the data readout drive circuit may obtain data stored in a memory, then process the data and further output a signal representing the data. However, there is a leakage current inside the circuit, resulting in relatively large static power consumption when the circuit does not operate, and even damaging the circuit and causing problems when the circuit operates.

Based on this, an embodiment of the disclosure provides a data transmission circuit. The data transmission circuit includes a control circuit and a processing circuit. The control circuit is configured to receive a first enable signal, and control the processing circuit to be in an operating state when the first enable signal is in an active state, and control the processing circuit to be in a non-operating state when the first enable signal is in a non-active state. The processing circuit is configured to receive an initial data signal and drive the initial data signal to obtain a target transmission signal when the processing circuit is in the operating state. In this way, the operating state of the processing circuit is controlled through the first enable signal and the control circuit, so that the processing circuit is in the operating state merely when the first enable signal is in the active state, and there is no leakage current path in the circuit when the processing circuit does not operate, thereby reducing the leakage current generated by the data transmission circuit, saving power consumption, and further preventing excessive leakage current from damaging the circuit.

The embodiments of the disclosure will be described in detail below with reference to the drawings.

According to an embodiment of the disclosure, FIG. 1 illustrates a first schematic structural diagram of a data transmission circuit 10 according to the embodiment of the disclosure. As illustrated in FIG. 1, the data transmission circuit 10 may include a control circuit 11 and a processing circuit 12.

The control circuit 11 is configured to receive a first enable signal, and control the processing circuit 12 to be in an operating state when the first enable signal is in an active state, and control the processing circuit 12 to be in a non-operating state when the first enable signal is in a non-active state.

The processing circuit 12 is configured to receive an initial data signal and drive the initial data signal to obtain a target transmission signal when the processing circuit 12 is in the operating state.

It should be noted that, the first enable signal may be a signal related to an operation implemented by the processing circuit 12. For example, the first enable signal may include at least one of a read operation signal, a write operation signal, a row address strobe signal, a column address strobe signal, or an activation operation signal. Alternatively, a first enable signal may be another type of signal, which is not specifically limited herein.

The control circuit 11 is configured to control the operating state of the processing circuit 12 based on the state of the first enable signal after receiving the first enable signal. When the first enable signal is in an active state, the processing circuit 12 is controlled to be in the operating state, so that the processing circuit 12 operates normally and implement a corresponding operation. When the first enable signal is in a non-active state, the processing circuit 12 is controlled to be in the non-operating state, so that the processing circuit 12 does not operate. In this way, when the first enable signal is in the non-active state, the processing circuit 12 does not operate and thus there is no power consumption. Compared with a circuit which is still turned on in a standby state, the leakage current can be reduced and power consumption can be saved.

The active state and the non-active state may be determined according to the level state of the first enable signal. In some embodiments, the first enable signal is determined to be in the non-active state when the first enable signal is at a first level state; and the first enable signal is determined to be in the active state when the first enable signal is at a second level state. The first level state may be a low level, and the second level state may be a high level.

It should be noted that, the first enable signal may be a waveform or pulse that varies periodically or aperiodically, and the level state of the first enable signal may vary between the first level state and the second level state. When the first enable signal is in the first level state with a low level, it is determined that the first enable signal is in the non-active state; and when the first enable signal is in the second level with a high level, it is determined that the first enable signal is in the active state. In some cases, the first enable signal may be in the active state when the first enable signal is at a low level and may be in the non-active state when the first enable signal is at a high level, which depends on the specific signal type and application scenario and is not specifically limited herein. For ease of description, the embodiments of the disclosure define that the first level state is the low level and the second level state is the high level.

Further, the first enable signal may be a numerical control code, and different numerical digits represent different states. For example, the first enable signal may include a numerical control code "0" and/or "1" (or another numerical digit). The first enable signal of "1" represents that, the first enable signal is in the active state, and the first enable signal of "0" represents that, the first enable signal is in the non-active state, thereby controlling the processing circuit 12.

When the processing circuit 12 is in the operating state, the processing circuit 12 is configured to receive the initial data signal and drive the initial data signal to obtain the target transmission signal. After obtaining the target transmission signal, the processing circuit 12 may output the target transmission signal, e.g., transmit the target transmission signal to another data port or another chip, memory controller, etc., in the circuit. Alternatively, the processing circuit 12 may write the target transmission signal, e.g., into a 1 Transistor 1 Capacitor (1T1C) of a storage unit in a Dynamic Random Access Memory (DRAM).

According to the embodiments of the disclosure, the initial data signal may be generated according to a data signal obtained through implementing a related operation(s) by the data transmission circuit 10 when the first enable signal is in an active state. For example, the data transmission circuit 10 is a circuit with a read function. When the first enable signal is a read operation signal and is in an active state, the data transmission circuit 10 is configured to implement a read operation to obtain a read data signal, and process the obtained read data signal to obtain the initial data signal. Alternatively, the obtained read data signal may be directly taken as the initial data signal, which is not specifically limited herein. When the first enable signal is a write operation signal and is in an active state, the data transmission circuit 10 is configured to implement a write operation to obtain a write data signal and process the obtained write data signal to obtain the initial data signal.

Figure 2:
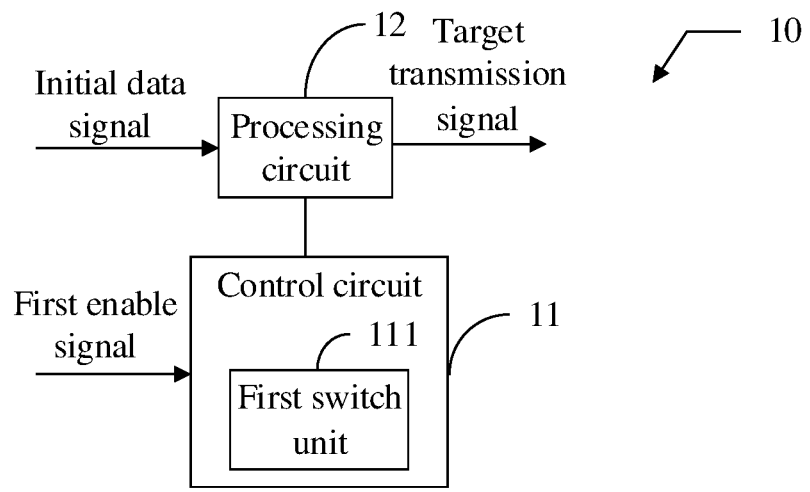
FIG. 2 illustrates a second schematic structural diagram of a data transmission circuit according to an embodiment of the disclosure.

In some embodiments, for the control circuit 11, FIG. 2 illustrates a second schematic structural diagram of a data transmission circuit 10 according to an embodiment of the disclosure. As illustrated in FIG. 2, the control circuit 11 may include a switch unit 111.

The control circuit 11 is configured to control the switch unit 111 to be turned on when the first enable signal is in the active state, to enable the processing circuit 12 to be in the operating state.

The control circuit 11 is further configured to control the switch unit 111 to be turned off when the first enable signal is in the non-active state, to enable the processing circuit 12 to be in the non-operating state.

It should be noted that, according to the embodiments of the disclosure, the processing circuit 12 may be controlled through the switch unit 111. When the first enable signal is in the active state, the switch unit 111 is controlled to be turned on, so that the processing circuit 12 is turned on and in the operating state; and when the first enable signal is in the non-active state, the switch unit 111 is controlled to be turned off, so that the processing circuit 12 is turned off and in the non-operating state. The switch unit 111 is controlled to be turned on or off according to the state of the first enable signal to control the processing circuit 12 to operate or not, thereby avoiding power consumption generated when the processing circuit 12 is still in a operating state when not required to operate.

The switch unit 111 may be a component with a switch control function, e.g., a diode, triode, field effect transistor (FET), thyristor or the like, which is not specifically limited herein.

For example, the switch unit 111 may be a field effect transistor. When the switch unit 111 includes a first transistor, the first transistor may include a first terminal, a second terminal, and a third terminal.

The first terminal is coupled to the first enable signal, the second terminal is coupled to a power supply terminal or a ground terminal, and the third terminal is coupled to the processing circuit 12.

It should be noted that, the first terminal of the first transistor is a control terminal, the first terminal is coupled to the first enable signal for receiving the first enable signal, and voltage variation of the first terminal may be able to turn on or off the first transistor. The second terminal is coupled to the power supply terminal or the ground terminal; and the third terminal is coupled to the processing circuit 12 to control the state of the processing circuit 12, so that the processing circuit 12 is in the operating state or the non-operating state.

For example, the connection mode and operating mode of the first transistor will be described in detail below by taking the first transistor to be an Negative channel Metal Oxide Semiconductor field effect transistor (NMOS) or a Positive channel Metal Oxide Semiconductor field effect transistor (PMOS) as an example.

Figure 3:
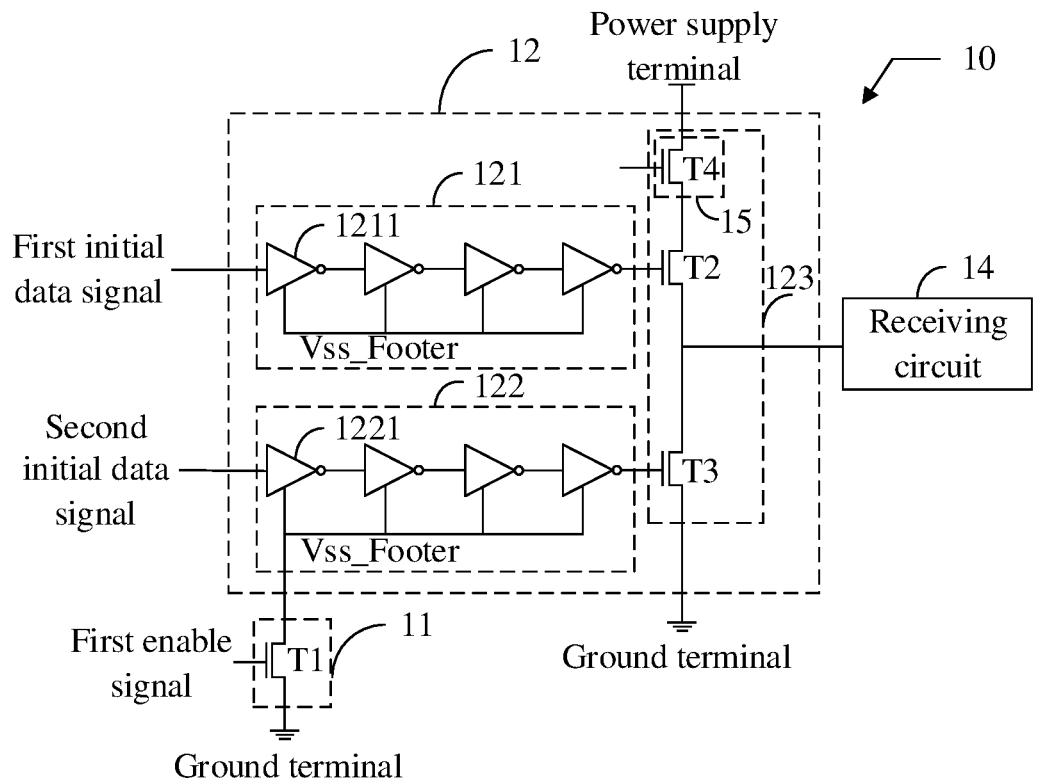
FIG. 3 illustrates a first schematic structural diagram of circuits of a data transmission circuit according to an embodiment of the disclosure.

When the first transistor is an NMOS transistor, FIG. 3 illustrates a first schematic structural diagram of circuits of a data transmission circuit 10 according to an embodiment of the disclosure. As illustrated in FIG. 3, when the first transistor T1 is an NMOS transistor, a first terminal of the first transistor T1 is a gate terminal directly connected to the first enable signal for receiving the first enable signal; a second terminal of the first transistor T1 is a source terminal connected to a ground terminal; and a third terminal of the first transistor T1 is a drain terminal connected to the processing circuit 12.

As illustrated in FIG. 3, the processing circuit 12 may include a first processing circuit 121 and a second processing circuit 122. The first processing circuit 121 includes an even number of first inverters 1211, and the second processing circuit 122 includes an even number of second inverters 1221. A ground port (Vss_Footer) of each first inverter 1211 and a ground port (Vss_Footer) of each second inverter 1221 in the processing circuit 12 are connected to the drain terminal of the first transistor T1. FIG. 3 merely illustrates that the first transistor T1 is connected to each second inverter 1221, and it is to be understood that, the drain terminal of the first transistor T1 is also connected to each first inverter 1211 in the first processing circuit 121, which is not illustrated in FIG. 3. Further, each first inverter 1211 and each second inverter 1221 further include a power supply port (Vdd_Footer) connected to a power supply terminal, which is not illustrated in FIG. 3.

Figure 4:
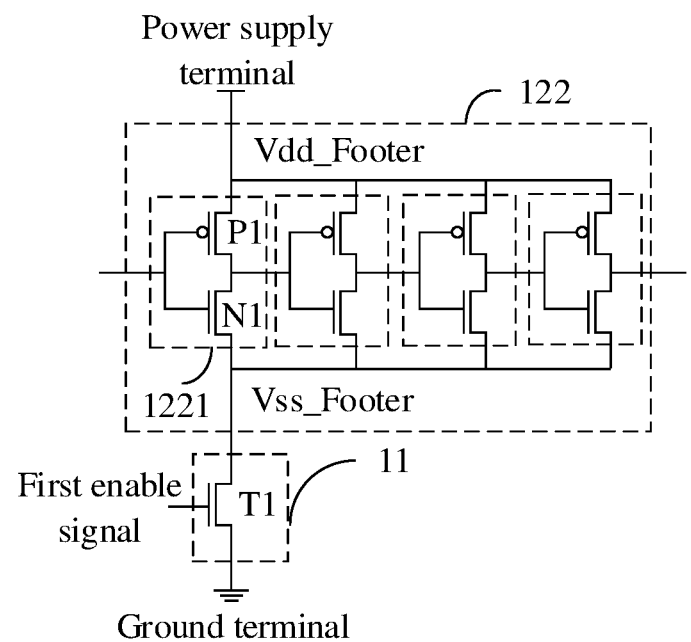
FIG. 4 illustrates a first schematic structural diagram of part of circuits of a data transmission circuit according to an embodiment of the disclosure.

According to a specific embodiment, FIG. 4 illustrates a first schematic structural diagram of part of circuits of a data transmission circuit 10 according to the embodiment of the disclosure, which corresponds to the circuit structure and connection mode of the second processing circuit 122 illustrated in FIG. 3. As illustrated in FIG. 4, for any one of the second inverters 1221, the second inverter 1221 includes a PMOS transistor P1 and an NMOS transistor N1. Gate terminals of P1 and N1 are both connected to the initial data signal, a drain terminal of P1 is connected to a drain terminal of N1, a source terminal of P1, i.e., a power supply port (Vdd_Footer) of the second inverter 1221, is connected to a power supply terminal, and a source terminal of N1, i.e., a ground port (Vss_Footer) of the second inverter 1221, is connected to a drain terminal of a first transistor T1.

Further, although the first processing circuit 121 is not illustrated in FIG. 4, the first processing circuit 121 and the second processing circuit 122 have substantially same composition and connection mode (the difference is that, the number of second inverters 1221 may be different from that of first inverters 1211). Each first inverter 1211 in the first processing circuit 121 is also connected to the first transistor T1 and the power supply terminal respectively, which will not be elaborated herein.

That is, the drain terminal of the first transistor T1 is connected to the source terminal of N1 in each first inverter 1211 and each second inverter 1221, thereby controlling the state of the processing circuit 12.

It should be noted that, the first transistor T1 controls the first processing circuit 121 and the second processing circuit 122 synchronously. Accordingly, with reference to FIG. 3 and FIG. 4, the control procedure will be described in detail below by taking the second processing circuit 122 as an example.

An NMOS transistor is turned off when a gate terminal is at a low level and is turned on when the gate terminal is at a high level. As illustrated in FIG. 3 or FIG. 4, a gate terminal of the first transistor T1 directly receives the first enable signal. Alternatively, the first enable signal may pass through multiple devices (e.g., one or more inverters, D flip-flops, etc.) and then reach the gate terminal of the first transistor T1. When the first enable signal is at a high level, the first transistor T1 is turned on, a drain terminal of the first transistor T1 is clamped to a ground voltage (VSS), so that a source terminal (i.e., Vss_Footer) of N1 connected to the first transistor T1 is clamped to the ground voltage (VSS), the second inverter 1221 and the first inverter 1211 are turned on, and the processing circuit 12 is in the operating state. When the first enable signal is at a low level, the first transistor T1 is turned off, the voltage at the drain terminal of the first transistor T1 is in a suspension state between the ground voltage (VSS) and an internal voltage (VCC), the second inverter 1221 and the first inverter 1211 are not turned on, and the processing circuit 12 is in the non-operating state.

That is, if the first enable signal is in the active state when the first enable signal is at a high level, the first transistor T1 is turned on merely when the first enable signal is at the high level, to enable the processing circuit 12 to be in the operating state. Exemplarily, such signal may be a read operation signal (RdEn).

Further, if a certain type of first enable signal is in an active state when the signal is at a low level, i.e., the processing circuit 12 operates when the first enable signal is at the low level, in such case, an inverter may be additionally arranged before the first transistor T1 to invert the first enable signal, and the inverted first enable signal is used to control the first transistor T1 to be turned on or off as required.

Figure 5:
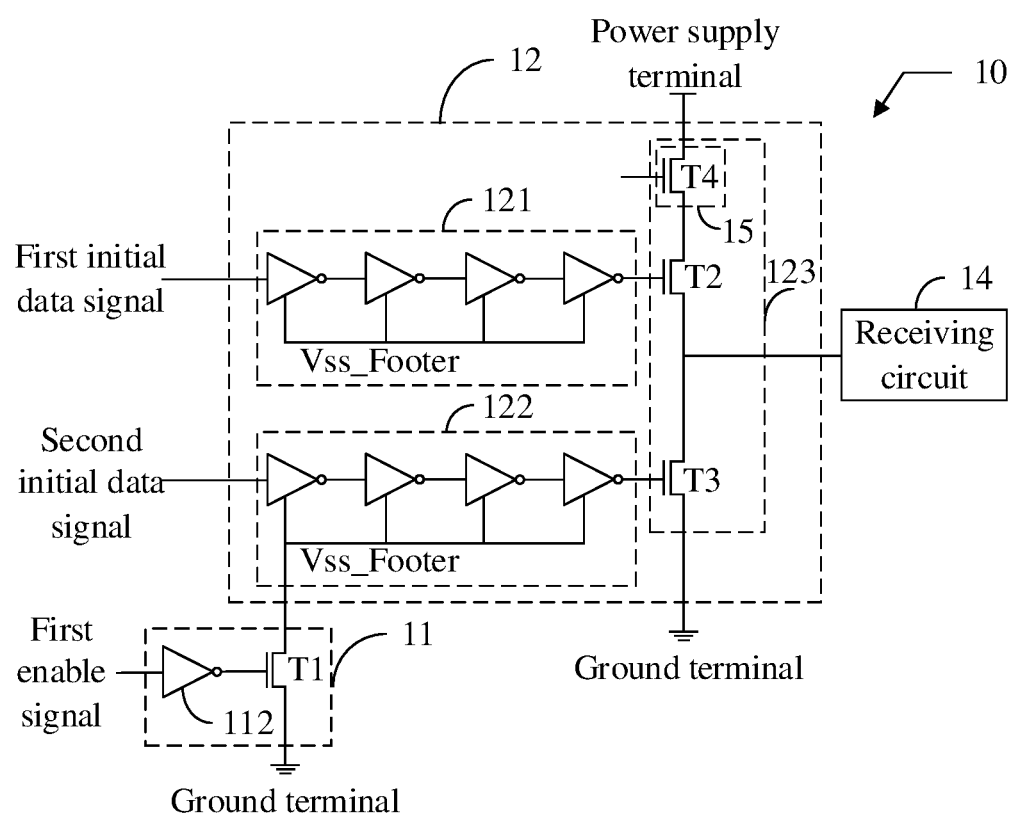
FIG. 5 illustrates a second schematic structural diagram of circuits of a data transmission circuit according to an embodiment of the disclosure.

FIG. 5 illustrates a second schematic structural diagram of circuits of a data transmission circuit 10 according to an embodiment of the disclosure. As illustrated in FIG. 5, the first transistor T1 is an NMOS transistor, and the control circuit 11 further includes an inverter 112. A first terminal of the first transistor T1 is a gate terminal connected to an output terminal of the inverter 112. An input terminal of the inverter 112 receives the first enable signal, and the inverter 112 is configured to invert the first enable signal to obtain an inverted first enable signal. A second terminal of the first transistor T1 is a source terminal connected to a ground terminal, and a third terminal of the first transistor T1 is a drain terminal connected to the processing circuit 12.

In this way, the inverter 112 inverts the first enable signal to obtain the inverted first enable signal, so that the gate terminal of the first transistor T1 receives the inverted first enable signal, thereby correctly controlling the circuit.

Figure 6:
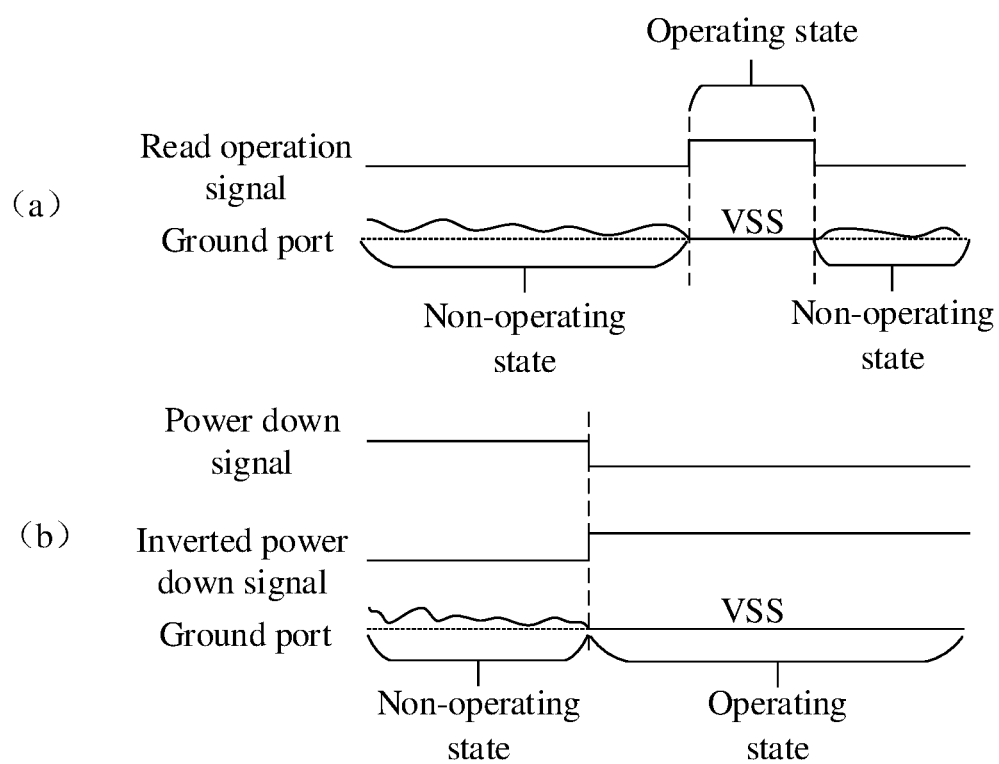
FIG. 6 illustrates a first schematic diagram of signal timing according to an embodiment of the disclosure.

Exemplarily, FIG. 6 illustrates a first schematic diagram of signal timing according to an embodiment of the disclosure. FIG. 6 illustrates a control timing diagram of a data transmission circuit 10 when a processing circuit 12 implements a read operation. (a) illustrates signal timing of a read operation signal and voltage variation of a ground port when the circuit illustrated in FIG. 3 is controlled with the read operation signal as the first enable signal; and (b) illustrates signal timing of a power down signal (Pdn), signal timing of an inverted power down signal, and voltage variation of a ground port when the circuit illustrated in FIG. 4 is controlled with the power down signal (Pdn) as the first enable signal.

As illustrated in (a) of FIG. 6, when the read operation signal is at a low level state, no read operation is required during the period, the first transistor T1 is not turned on, the voltage at the ground port is between a ground voltage (VSS) and an internal voltage (VCC), and the ground port is not connected to a ground terminal, so that the processing circuit 12 is in the non-operating state. When the read operation signal is at a high level state, the circuit is required to implement a read operation during the period, the first transistor T1 is turned on, the voltage at the ground port is clamped to the ground voltage (VSS), and the ground port is connected to the ground terminal, so that the processing circuit 12 is in the operating state.

As illustrated in (b) of FIG. 6, when the power down signal is at a high level state, the circuit is required to be in a power down state (or a standby state) and the processing circuit 12 is required to be controlled to be in the non-operating state. In this case, the inverted power down signal is at a low level state, the first transistor T1 is not turned on, and the processing circuit 12 is in the non-operating state. When the power down signal is at a low level state, the circuit is required to be out of the power down state to operate, and the processing circuit 12 is required to be controlled to be in the operating state. In this case, the inverted power down signal is at a high level state, the first transistor T1 is turned on, the voltage at the ground port is clamped to the ground voltage (VSS), the ground port is connected to the ground terminal, and the processing circuit 12 is in the operating state.

Therefore, the first transistor T1 is controlled to be turned on or off through the first enable signal, and further the processing circuit 12 is controlled to be in the operating state merely when the first enable signal is in an active state, thereby reducing the leakage current generated by the processing circuit 12 and reducing power consumption. Specifically, a first inverter 1211 and a second inverter 1221 in the processing circuit 12 are mainly controlled to operate or not, thereby reducing the leakage current generated by the first inverter 1211 and the second inverter 1221.

Figure 7:
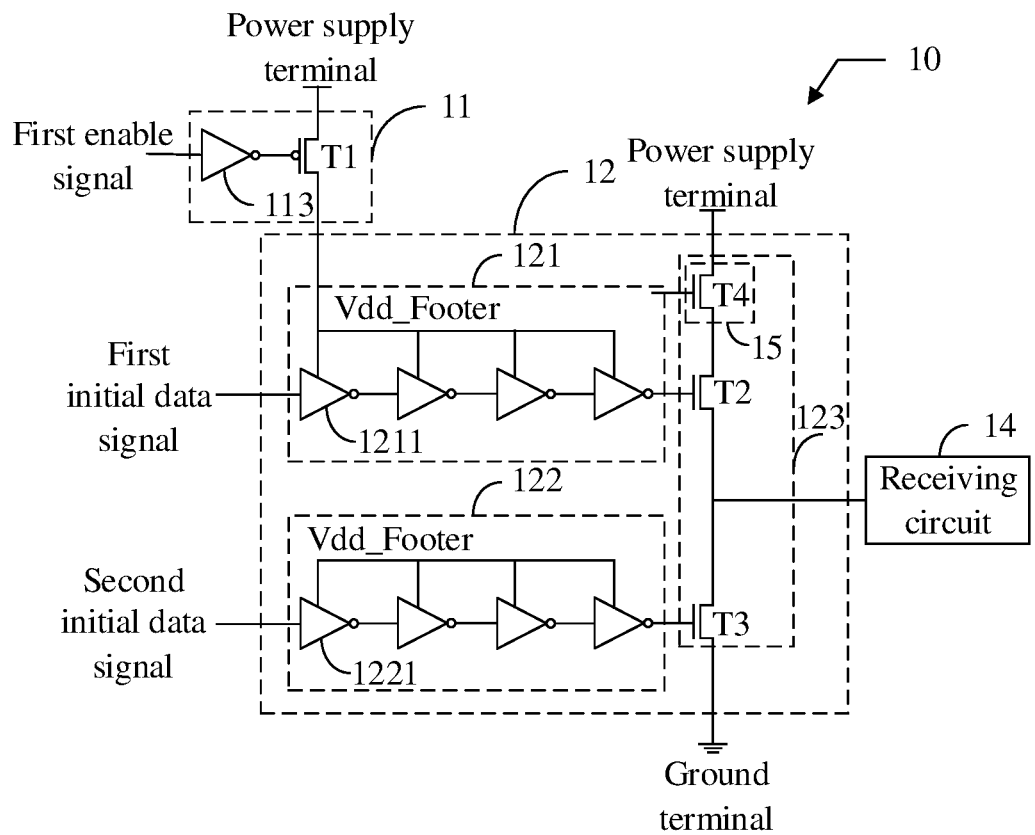
FIG. 7 illustrates a third schematic structural diagram of circuits of a data transmission circuit according to an embodiment of the disclosure.

When the first transistor T1 is a PMOS transistor, FIG. 7 illustrates a third schematic structural diagram of circuits of a data transmission circuit 10 according to an embodiment of the disclosure. As illustrated in FIG. 7, when the first transistor T1 is a PMOS transistor, the control circuit 11 further includes an inverter 113. A first terminal of the first transistor T1 is a gate terminal connected to an output terminal of the inverter 113, and an input terminal of the inverter 113 is connected to the first enable signal. The inverter 113 inverts the first enable signal to obtain an inverted first enable signal, and the inverted first enable signal is used to control the first transistor T1 to be turned on or off. A second terminal of the first transistor T1 is a source terminal connected to a power supply terminal, and a third terminal of the first transistor T1 is a drain terminal connected to the processing circuit 12.

The processing circuit 12 illustrated in FIG. 7 has the same composition as that of the processing circuit 12 illustrated in FIG. 3, except the connection mode between the inverter and the first transistor T1. As illustrated in FIG. 7, a power supply port (Vdd_Footer) of each first inverter 1211 and each second inverter 1221 is connected to a drain terminal of the first transistor T1. FIG. 7 merely illustrates that the first transistor T1 is connected to each first inverter 1211, and it should be understood that, the drain terminal of the first transistor T1 is also connected to each second inverter 1221 in the second processing circuit 122, which is not illustrated in FIG. 7. Further, each first inverter 1211 and each second inverter 1221 further includes a ground port (Vss_Footer) connected to a ground terminal, which is not illustrated in FIG. 7.

Figure 8:
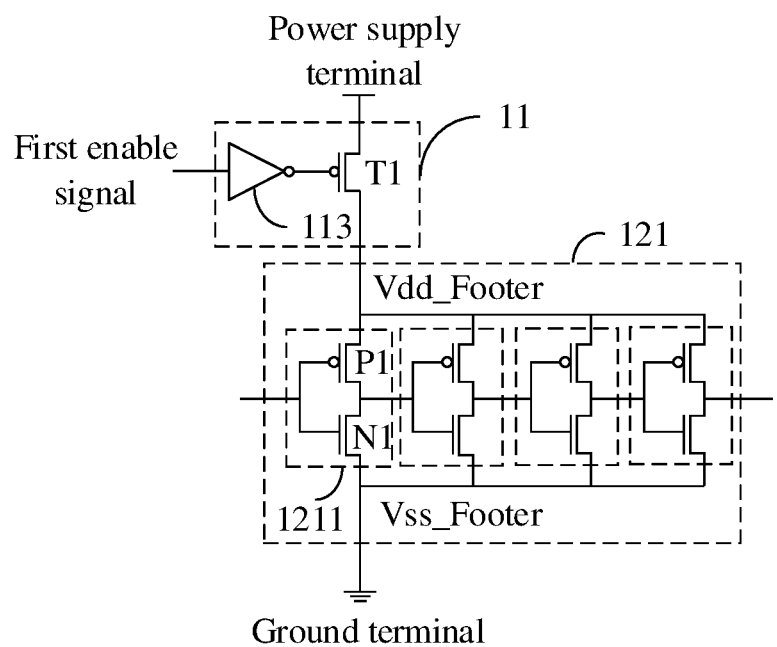
FIG. 8 illustrates a second schematic structural diagram of part of circuits of a data transmission circuit according to an embodiment of the disclosure.

According to a specific embodiment, FIG. 8 illustrates a second schematic structural diagram of part of circuits of a data transmission circuit 10 according to the embodiment of the disclosure, which corresponds to the circuit structure and connection mode of the first processing circuit 121 illustrated in FIG. 7. As illustrated in FIG. 8, for any one of the first inverters 1211, the first inverter 1211 includes a PMOS transistor P1 and an NMOS transistor N1. Gate terminals of P1 and N1 are both connected to the initial data signal, a drain terminal of P1 is connected to a drain terminal of N1, a source terminal of P1, i.e., a power supply port (Vdd_Footer) of the first inverter 1211, is connected to a drain terminal of the first transistor T1, and a source terminal of N1, i.e., a ground port (Vss_Footer) of the first inverter 1211, is connected to the ground terminal.

Further, although the second processing circuit 122 is not illustrated in FIG. 8, the first processing circuit 121 and the second processing circuit 122 have substantially same composition and connection mode (the difference is that the number of second inverters 1221 may be different from that of first inverters 1211). Each second inverter 1221 in the second processing circuit 122 is also connected to the first transistor T1 and the ground terminal respectively, which will not be elaborated herein.

That is, the drain terminal of the first transistor T1 is connected to the source terminal of P1 in each first inverter 1211 and each second inverter 1221, thereby controlling the state of the processing circuit 12.

It should be noted that, the first transistor T1 controls the first processing circuit 121 and the second processing circuit 122 synchronously. Accordingly, with reference to FIG. 7 and FIG. 8, the control procedure will be described in detail below by taking the first processing circuit 121 as an example.

A PMOS transistor is turned on when a gate terminal is at a low level and is turned off when the gate terminal is at a high level. As illustrated in FIG. 7 or FIG. 8, a gate terminal of the first transistor T1 receives an inverted first enable signal. When the first enable signal is at a high level, the inverted first enable signal is at a low level, the first transistor T1 is turned on, and a drain terminal of the first transistor T1 is clamped to a power supply voltage (VDD), so that a source terminal (i.e., Vdd_Footer) of P1 connected to the first transistor T1 is clamped to the power supply voltage, the first inverter 1211 and the second inverter 1221 are turned on, and the processing circuit 12 is in the operating state. When the first enable signal is at a low level, the inverted first enable signal is at a high level, the first transistor T1 is turned off, the voltage at the drain terminal of the first transistor T1 is in a suspension state between the power supply voltage (VDD) and an internal voltage (VCC), the first inverter 1211 and the second inverter 1221 are not turned on, and the processing circuit 12 is in the non-operating state.

That is, if the first enable signal is in the active state when the first enable signal is at a high level, the first transistor T1 is turned on merely when the first enable signal is at the high level, to enable the processing circuit 12 to be in the operating state. Exemplarily, such signal may be a read operation signal.

Further, if a certain type of first enable signal is in an active state when the first enable signal is at a low level, i.e., the processing circuit 12 operates when the first enable signal is at the low level. In such case, the inverter 113 may be removed from the control circuit 11, so that the first transistor T1 may be turned on or off as required.

Figure 9:
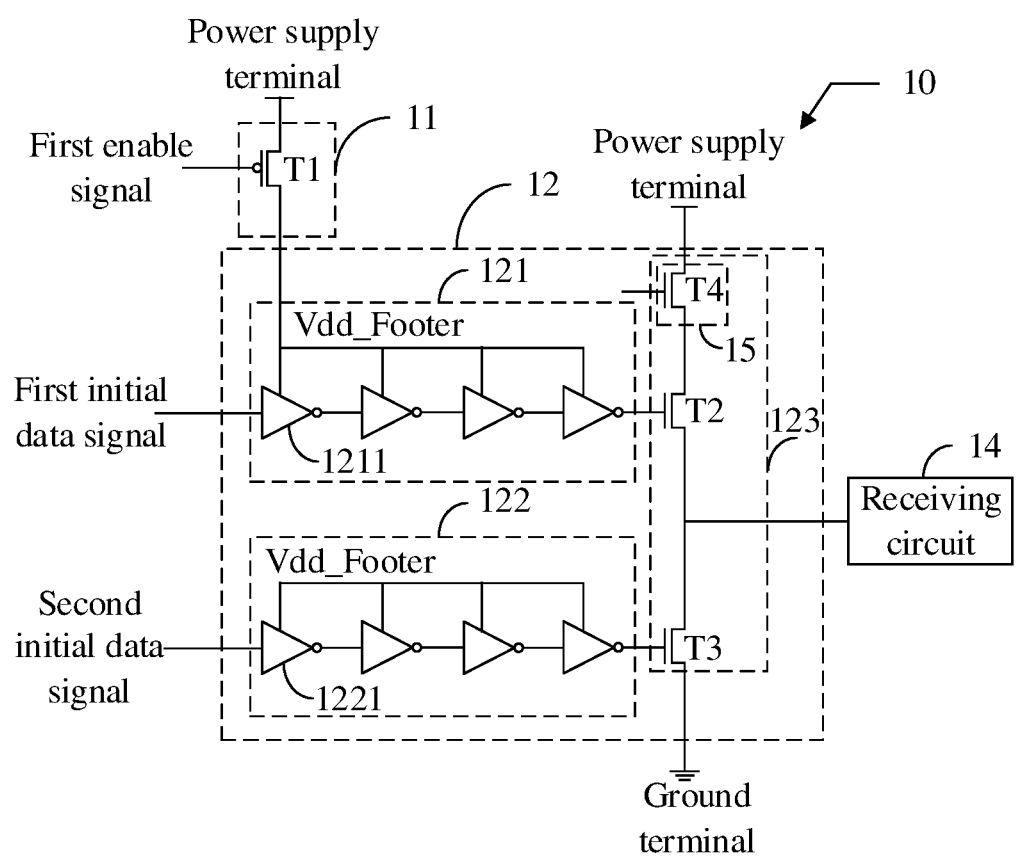
FIG. 9 illustrates a fourth schematic structural diagram of circuits of a data transmission circuit according to an embodiment of the disclosure.

FIG. 9 illustrates a fourth schematic structural diagram of circuits of a data transmission circuit 10 according to an embodiment of the disclosure. As illustrated in FIG. 9, the first transistor is a PMOS transistor, and a first terminal of the first transistor T1 is a gate terminal for directly receiving the first enable signal. Alternatively, the first enable signal may pass through multiple devices (e.g., one or more inverters, D flip-flops, etc.) and then reach the gate terminal of the first transistor T1. A second terminal of the first transistor T1 is a source terminal connected to a power supply terminal, and a third terminal of the first transistor T1 is a drain terminal connected to the processing circuit 12.

In this way, the gate terminal of the first transistor T1 may directly receive the first enable signal, thereby correctly controlling the circuit.

Figure 10:
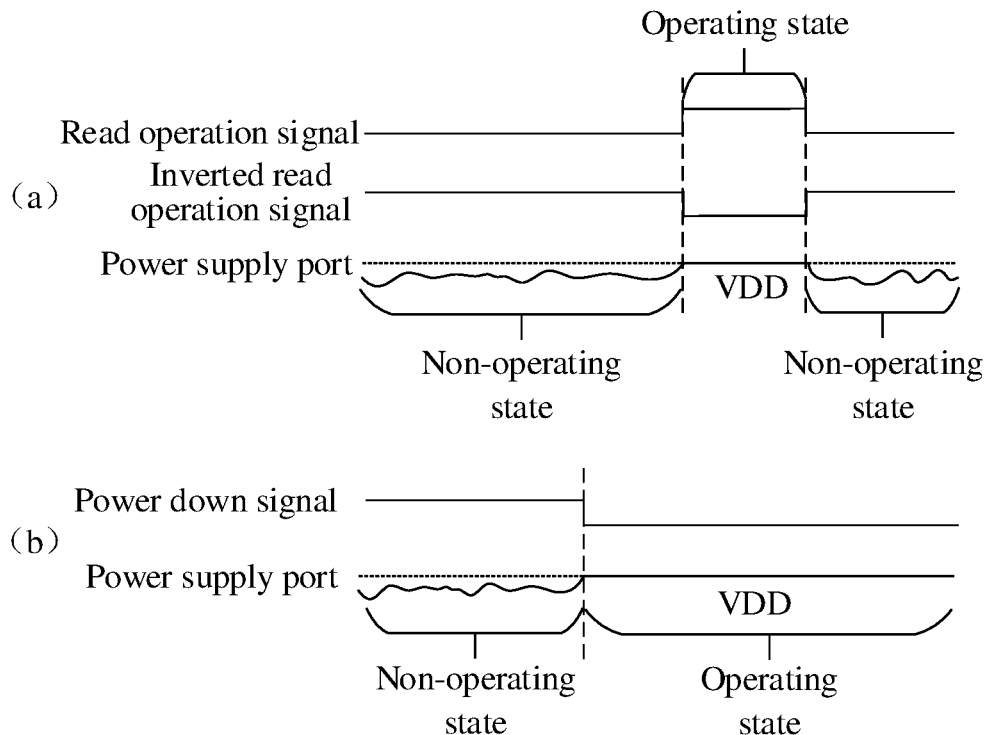
FIG. 10 illustrates a second schematic diagram of signal timing according to an embodiment of the disclosure.

Exemplarily, FIG. 10 illustrates a second schematic diagram of signal timing according to an embodiment of the disclosure. FIG. 10 illustrates a control timing diagram of a data transmission circuit 10 when a processing circuit 12 implements a read operation. (a) illustrates signal timing of a read operation signal, signal timing of an inverted read operation signal, and voltage variation of a power supply port when the circuit illustrated in FIG. 7 is controlled with the read operation signal as the first enable signal; and (b) illustrates signal timing of a power down signal and voltage variation of a ground port when the circuit illustrated in FIG. 7 is controlled with the power down signal as the first enable signal.

As illustrated in (a) of FIG. 10, when the read operation signal is at a low level state, the inverted read operation signal is at a high level state, the first transistor T1 is not turned on, the voltage at the ground port is between a power supply voltage (VDD) and an internal voltage (VCC), and the ground port is not connected to a power supply terminal, so that the processing circuit 12 is in the non-operating state. When the read operation signal is at a high level state, the circuit is required to implement a read operation during the period, the inverted read operation signal is at a low level state, the first transistor T1 is turned on, the ground port is clamped to the power supply voltage (VDD), and the ground port is connected to the power supply terminal, so that the processing circuit 12 is in the operating state.

As illustrated in (b) of FIG. 10, when the power down signal is at a high level state, the processing circuit 12 is required to be controlled to be in the non-operating state, and in this case, the first transistor T1 is not turned on, and the processing circuit 12 is in the non-operating state. When the power down signal is at a low level state, the processing circuit 12 is required to be controlled to be in the operating state, and in this case, the first transistor T1 is turned on, and the processing circuit 12 is in the operating state.

Further, with reference to FIG. 6 and FIG. 10, compared with the power down signal as the first enable signal, when the first transistor T1 (whether an NMOS transistor or PMOS transistor) is controlled with a read operation signal as the first enable signal, the processing circuit 12 can be more accurately controlled to be in the operating state merely during the read operation and to be in the non-operating state during the remaining time, thereby reducing more leakage current and more power consumption of the circuit. Therefore, in actual application, a suitable first enable signal may be configured according to the features of different signals and specific requirements of the circuit to accurately control the processing circuit 12.

In a specific implementation, an initial data signal for the processing circuit 12 includes a first initial data signal and a second initial data signal, and the first initial data signal and the second initial data signal have opposite level states. As illustrated in FIG. 3 (or FIG. 7), a processing circuit 12 may include a first processing circuit 121, a second processing circuit 122, and an output circuit 123.

The first processing circuit 121 is configured to drive the first initial data signal to obtain a first drive signal when the processing circuit 12 is in the operating state.

The second processing circuit 122 is configured to drive the second initial data signal to obtain a second drive signal when the processing circuit 12 is in the operating state.

The output circuit 123 is configured to obtain the target transmission signal according to the first drive signal and the second drive signal.

It should be noted that, by taking the circuit in FIG. 3 as an example, the processing circuit 12 may be a data readout drive circuit including the first processing circuit 121, the second processing circuit 122 and the output circuit 123. The circuit may be configured to implement a read operation, read and transmit data. The initial data signal may include a first initial data signal and a second initial data signal, and then the first initial data signal and the second initial data signal are generated according to a data signal read by the data transmission circuit 10 when a read operation signal is in an active state.

The data transmission circuit 10 may further include a readout circuit (which is not illustrated in FIG. 3), configured to read a data signal from a storage circuit (e.g., a storage unit, which is not illustrated in FIG. 3) and process the data signal to obtain the first initial data signal and the second initial data signal.

For example, the readout circuit may include two parts. After reading a data signal, the first part is configured to directly transmit the data signal as the first initial data signal to the first processing circuit 121. Alternatively, the first part may include an even number of inverters to invert the data signal for an even number of times to obtain a first initial data signal with the same logic state as that of the read data signal. The second part may include an inverter to invert the data signal once after the data signal is read, and the inverted data signal as the second initial data signal is transmitted to the second processing circuit 122. Alternatively, the second part may include another odd number of inverters to invert the data signal for an odd number of times to obtain a second initial data signal with the logic state opposite to that of the read data signal.

That is, the first initial data signal has an opposite level state to the second initial data signal.

Therefore, in some embodiments, when the data signal is a first value, the first initial data signal is determined to be at a first level, and the second initial data signal is determined to be at a second level.

When the data signal is a second value, the first initial data signal is determined to be at the second level state, and the second initial data signal is determined to be at the first level state.

It should be noted that, the data signal may be stored in a storage unit in the form of logic "1" or logic "0". The first value may represent logic "0" corresponding to a low level, and the second value may represent logic "1" corresponding to a high level. When the data signal is the first value, it is determined that the first initial data signal is at the first level state, i.e., low level, and the second initial data is at the second level state, i.e., high level. When the data signal is the second value, it is determined that the first initial data signal is at the second level state, and the second initial data signal is at the first level state.

When the processing circuit 12 is in the operating state, the first processing circuit 121 receives the first initial data signal and drive the first initial data signal to obtain a first drive signal; and the second processing circuit 122 receives the second initial data signal and drive the second initial data signal to obtain a second drive signal; and the output circuit 123 obtains a target transmission signal based on the first drive signal and the second drive signal and output the target transmission signal or transmit the target transmission signal to another port or circuit in the circuit.

With reference to FIG. 3 or FIG. 7, the data transmission circuit 10 may further include a receiving circuit 14.

The processing circuit 12 is further configured to transmit the target transmission signal to the receiving circuit 14 after obtaining the target transmission signal.

It should be noted that, the receiving circuit 14 may be configured to receive the target transmission signal obtained by the processing circuit 12.

In some embodiments, the receiving circuit 14 may include a data pad when the first enable signal includes a read operation signal; and the receiving circuit 14 may include a storage unit when the first enable signal includes a write operation signal.

It should be noted that, the data transmission circuit 10 may be a circuit with a read function. In this case, the first enable signal may be a read operation signal, and correspondingly, the receiving circuit 14 may include a data pad (DQPAD), and the processing circuit 12 is configured to transmit a target transmission signal obtained after reading and processing to the data pad to read and transmit data.

The data transmission circuit 10 may further be a circuit with a write function. Then, the first enable signal may be a write operation signal, and correspondingly, the receiving circuit 14 may include a storage unit, e.g., the storage unit may be a 1T1C unit in a DRAM, and the processing circuit 12 may be configured to write the target transmission data after obtaining the target transmission signal, so as to write data into the storage unit.

Exemplarily, the first processing circuit 121 may be a pull-up circuit, and the first initial data signal may be a pull-up signal (DataPU); and the second processing circuit 122 may be a pull-down circuit, and the second initial data signal may be a pull-down signal (DataPD).

In a specific embodiment, with reference to FIG. 3 (or FIG. 7), the first processing circuit 121 in the processing circuit 12 may include N first inverters 1211. An input terminal of the 1st first inverter 1211 receives the first initial data signal, an output terminal of the (i)th first inverter 1211 is connected to an input terminal of the (i+1)th first inverter 1211, an output terminal of the (N)th first inverter 1211 outputs a first drive signal, and enable terminals of the N first inverters 1211 are connected to the control circuit 11. i is an integer greater than 0 and less than N, and N is an even number greater than 0.

The second processing circuit 122 in the processing circuit 12 may include M second inverters 1221. An input terminal of the 1st second inverter 1221 receives the second initial data signal, an output terminal of the (j)th second inverter 1221 is connected to an input terminal of the (j+1)th second inverter 1221, an output terminal of the (M)th second inverter 1221 outputs a second drive signal, and enable terminals of the M second inverters 1221 are connected to the control circuit 11. j is an integer greater than 0 and less than M, and M is an even number greater than 0.

It should be noted that, as illustrated in FIG. 3 (or FIG. 7), the first processing circuit 121 may include four first inverters 1211 and the second processing circuit 122 may include four second inverters 1221. The number of the first inverters 1211 and that of the second inverters 1221 may be 2, 6, 8, etc. The number of the first inverters 1211 and that of the second inverters 1221 may be same or different, which is not specifically limited herein.

It should be further noted that, in the embodiments of the disclosure, both the first processing circuit 121 and the second processing circuit 122 include an even number of inverters. For example, as illustrated in FIG. 3, the first processing circuit 121 includes four first inverters 1211, and driving enhancement is performed on the first initial data signal through the four first inverters 1211. Therefore, the first drive signal finally obtained is an enhanced signal, so that the signal strength is not too weak due to loss in transmission, thereby avoiding misreading or signal loss. The same is also applied for the second processing circuit 122, which will not be elaborated herein.

Further, with reference to FIG. 4, in the data transmission circuit 10 illustrated in FIG. 3, an enable terminal of each first inverter 1211 and each second inverter 1221 is a source terminal of N1, i.e., a ground port (Vss_Footer). With reference to FIG. 9, in the data transmission circuit 10 illustrated in FIG. 7, an enable terminal of each first inverter 1211 and each second inverter 1221 is a source terminal of P1, i.e., a power supply port (Vdd_Footer).

The circuit structure of the first processing circuit 121 and the second processing circuit 122 may be understood with reference to FIG. 4 and FIG. 8, which will not be elaborated herein.

In this way, the first transistor T1 is controlled through the first enable signal to be turned on or off, and then the voltage state of the enable terminal of each first inverter 1211 and that of each second inverter 1221 are controlled, to enable the first inverter 1211 and the second inverter 1221 to be turned on or off, thereby controlling the first processing circuit 121 and the second processing circuit 122 to operate normally merely when the first enable signal is in an active state, and reducing the leakage current.

In some embodiments, as illustrated in FIG. 3 (or FIG. 7), the output circuit 123 in the processing circuit 12 may include a second transistor T2 and a third transistor T3.

A gate terminal of the second transistor T2 is connected to an output terminal of the first processing circuit 121, a gate terminal of the third transistor T3 is connected to an output terminal of the second processing circuit 122, one terminal of the second transistor T2 is connected to a power supply terminal, and one terminal of the third transistor T3 is connected to a ground terminal.

Another terminal of the second transistor T2 is connected to another terminal of the third transistor T3 for outputting the target transmission signal.

It should be noted that, in the embodiments of the disclosure, the output circuit 123 may include the second transistor T2 and the third transistor T3. The gate terminal of the second transistor T2 is connected to the output terminal of the first processing circuit 121 to receive a first drive signal, and the gate terminal of the third transistor T3 is connected to the output terminal of the second processing circuit 122 to receive a second drive signal; and further, one terminal of the second transistor T2 and one terminal of the third transistor T3 are connected to the power supply terminal and the ground terminal respectively, and another terminal of the second transistor T2 is connected to another terminal of the third transistor T3 to output the target transmission signal. The second transistor T2 and the third transistor T3 may be NMOS transistors or PMOS transistors, and the second transistor T2 and the third transistor T3 may be same or different in transistor type.

Exemplarily, as illustrated in FIG. 3, the second transistor T2 and the third transistor T3 both may be NMOS transistors. A gate terminal of the second transistor T2 is connected to an output terminal of the first processing circuit 121, i.e., to an output terminal of the (N)th first inverter 1211 for receiving a first drive signal, and a source terminal of the second transistor T2 is connected to the power supply terminal; a gate terminal of the third transistor T3 is connected to an output terminal of the second processing circuit 122, i.e., to an output terminal of the (M)th second inverter 1221 for receiving a second drive signal, and a source terminal of the third transistor T3 is connected to the ground terminal; and a drain terminal of the second transistor T2 is connected to a drain terminal of the third transistor T3 for outputting the target transmission signal.

Exemplarily, if the data signal is a second value of logic "1", the first initial data signal is logic "1" and the second initial data signal is logic "0". The first initial data signal is driven by the first processing circuit 121 to obtain a first drive signal of logic "1", and the second initial data signal is driven by the second processing circuit 122 to obtain a second drive signal of logic "0"; and then a gate terminal of the second transistor T2 is at a high level, the second transistor T2 is turned on, a gate terminal of the third transistor T3 is at a low level, and the third transistor T3 is turned off; and the active second transistor T2 clamps a source terminal thereof to a power supply voltage and outputs a high-level signal, i.e., a target transmission signal of logic "1", thereby correctly reading the data.

Exemplarily, if the data signal is a first value of logic "0", the first initial data signal is logic "0" and the second initial data signal is logic "1". The first initial data signal is driven by the first processing circuit 121 to obtain a first drive signal of logic "0", and the second initial data signal is driven by the second processing circuit 122 to obtain a second drive signal of logic "1"; and then the gate terminal of the second transistor T2 is at a low level, the second transistor T2 is turned off, the gate terminal of a third transistor T3 is at a high level, and the third transistor T3 is turned on; and the active third transistor T3 clamps a drain terminal thereof to a ground voltage and outputs a low-level signal, i.e., a target transmission signal of logic "0", thereby correctly reading the data.

In some embodiments, the output circuit further includes a second switch unit 15.

The output circuit 123 is configured to receive a second enable signal and turn on the second switch unit 15 when the second enable signal is in an active state, turn on the third transistor T3 according to the second drive signal when the data signal is the first value, to enable the target transmission signal to be at the first level state, or turn on the second transistor T2 according to the first drive signal when the data signal is the second value, to enable the target transmission signal to be at the second level state.

It should be noted that, according to the embodiments of the disclosure, the second switch unit 15 may be additionally arranged in the data transmission circuit 10. The second switch unit 15 may be a diode, triode, field effect transistor, thyristor and another component with a switch control function, which is not specifically limited herein. Whether the second transistor T2 and the third transistor T3 are in the operating state is controlled through turning on or off the second switch unit 15, so that the leakage current generated by the second transistor T2 and the third transistor T3 in a standby state is avoided, thereby reducing power consumption.

Exemplarily, as illustrated in FIG. 3 or FIG. 7, the second switch unit 15 may include a fourth transistor T4. Specifically, the fourth transistor T4 may be an NMOS transistor. A gate terminal of the fourth transistor T4 receives a second enable signal, a source terminal thereof is connected to the power supply terminal, and a drain terminal thereof is connected to a source terminal of the second transistor T2, i.e., one terminal of the second transistor T2 is connected to the power supply terminal through the second switch unit 15. When the second enable signal is in an active state, the fourth transistor T4 is turned on, and when the second enable signal is in a non-active state, the fourth transistor T4 is turned off.

When the fourth transistor T4 is turned on, if the data signal is a first value and is at a low level state, the first drive signal has the same logic state as the data signal, i.e., the first drive signal is at the low level state, so that the second transistor T2 is not turned on; and meanwhile, the second drive signal has the opposite logic state to the data signal, i.e., the second drive signal is at a high level state, so that the third transistor T3 is turned on. In this case, a drain terminal of the third transistor T3 is pulled to the ground voltage (VSS), and then the output target transmission signal is at the low level state, i.e., the first level state.

When the fourth transistor T4 is turned on, if the data signal is a second value and is at a high level state, the first drive signal has the same logic state as the data signal, i.e., the first drive signal is at the high level state, so that the second transistor T2 is turned on; and meanwhile, the second drive signal has the opposite logic state to the data signal, i.e., the second drive signal is at a low level state, so that the third transistor T3 is not turned on. In this case, a drain terminal of the second transistor T2 is pulled to the power supply voltage (VDD), and then the output target transmission signal is at the high level state, i.e., the second level state.

That is, in the embodiments of the disclosure, the first processing circuit 121 is mainly configured to output the second value, and the second processing circuit 122 is mainly configured to output the first value.

Further, in combination with a second enable signal actually applied, an inverter may be additionally arranged before the fourth transistor T4 to control the second transistor T2 and the third transistor T3 to operate as required, details of which may be understood with reference to those of the first enable signal and will not be repeated herein.

The fourth transistor T4 may further be a PMOS transistor. In this case, the fourth transistor T4 is connected to the ground terminal and the third transistor T3 respectively, i.e., one terminal of the third transistor T3 is connected to the ground terminal through the second switch unit 15, and the second transistor T2 is connected to the power supply terminal.

It should be further noted that, the first enable signal used for controlling the first transistor T1 and the second enable signal used for controlling the fourth transistor T4 may be the same or different, i.e., the first enable signal and the second enable signal may be the same signal or two different signals, which may be configured in combination with actual requirements, and is not specifically limited herein.

The embodiments of the disclosure provide a data transmission circuit, including a control circuit and a processing circuit. The control circuit is configured to receive a first enable signal, and control the processing circuit to be in an operating state when the first enable signal is in an active state, and control the processing circuit to be in a non-operating state when the first enable signal is in a non-active state. The processing circuit is configured to receive an initial data signal and drive the initial data signal to obtain a target transmission signal when the processing is in the operating state. In this way, the operating state of the processing circuit is controlled through the first enable signal and the control circuit, so that the processing circuit is in the operating state only when the first enable signal is in the active state, and there is no leakage current path in the circuit when the processing circuit does not operate, thereby reducing the leakage current generated by the data transmission circuit, saving power consumption, and further preventing excessive leakage current from damaging the circuit.

Another embodiment of the disclosure provides a data transmission method.

Figure 11:
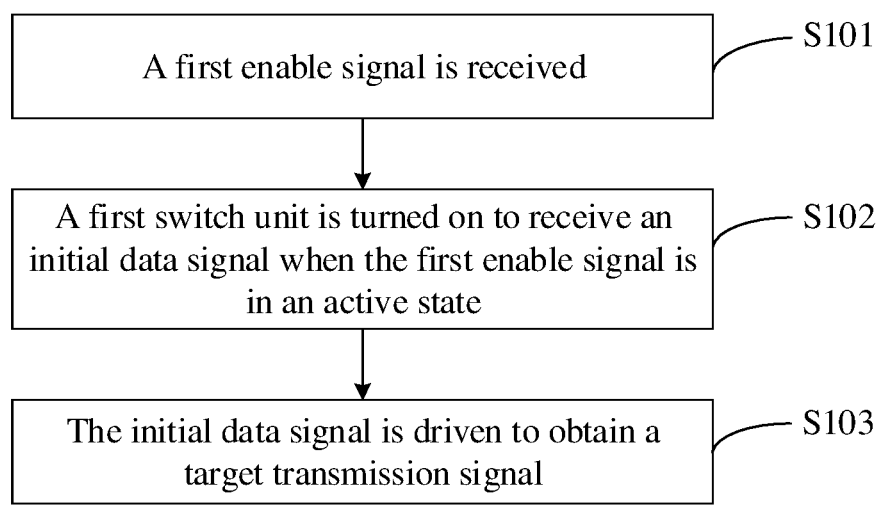
FIG. 11 illustrates a schematic flowchart of a data transmission method according to an embodiment of the disclosure.

FIG. 11 illustrates a schematic flowchart of a data transmission method according to the embodiment of the disclosure. As illustrated in FIG. 11, the method may include the following operations.

In S101, a first enable signal is received.

In S102, a first switch unit is turned on to receive an initial data signal when the first enable signal is in an active state.

In S103, the initial data signal is driven to obtain a target transmission signal.

It should be noted that, the data transmission method according to the embodiment of the disclosure may be applied to the data transmission circuit 10 according to the foregoing embodiments.

Specifically, the control circuit 11 receives the first enable signal, controls the processing circuit 12 to be in an operating state when the first enable signal is in an active state, and controls the processing circuit 12 to be in a non-operating state when the first enable signal is in a non-active state.

When the first enable signal is in the active state, the first switch unit 111 is turned on, the processing circuit 12 is in the operating state and configured to receive the initial data signal, and drive the initial data signal to obtain the target transmission signal. The initial data signal is generated according to a data signal obtained by the data transmission circuit 10 when the first enable signal is in the active state.

In this way, the initial data signal is driven merely when the first enable signal is in the active state, thereby reducing generation of the leakage current and saving power consumption.

According to some embodiments, the method may further include the following operations.

A first switch unit is controlled to be turned on when the first enable signal is in the active state.

The first switch unit is controlled to be turned off when the first enable signal is in the non-active state.

It should be noted that by using the control circuit 11, the first switch unit 111 is controlled to be turned on when the first enable signal is in the active state, and the first switch unit 111 is controlled to be turned off when the first enable signal is in the non-active state.

According to some embodiments, the method may further include the following operations.

It is determined that the first enable signal is in the non-active state when the first enable signal is at a first level state.

It is determined that the first enable signal is in the active state when the first enable signal is at a second level state.

According to some embodiments, the first level state is a low level and the second level state is a high level.

It should be noted that, the first enable signal may be determined to be in the non-active state when the first enable signal is in the first level state, and the first enable signal may be determined to be in the active state when the first enable signal is in the second level state. The first level state is a low level and the second level state is a high level. However, a certain type of signal may be in an active state when the signal is at the low level and in a non-active state when the signal is at the high level, which may be flexibly controlled in combination with the specific signal type.

According to some embodiments, the initial data signal includes a first initial data signal and a second initial data signal, and the first initial data signal has an opposite level state to the second initial data signal.

Correspondingly, the operation that the initial data signal is driven to obtain the target transmission signal may include the following operations.

The first initial data signal is driven through a first processing circuit to obtain a first drive signal.

The second initial data signal is driven through a second processing circuit to obtain a second drive signal.

The first drive signal and the second drive signal are received through an output circuit to output the target transmission signal.

It should be noted that, the initial data signal may include the first initial data signal and the second initial data signal having a level state opposite to the first initial data signal. When the initial data signal is processed, the first processing circuit performs driving on the first initial data signal to obtain the first drive signal, and transmits the first drive signal to the output circuit; and the second processing circuit performs driving on the second initial data signal to obtain the second drive signal, and transmits the second drive signal to the output circuit. After receiving the first drive signal and the second drive signal, the output circuit outputs the target transmission signal according to the first drive signal and the second drive signal.

According to some embodiments, the method may further include the following operations.

It is determined that the first initial data signal is at a first level state, and the second initial data signal is at a second level state when a data signal is a first value.

It is determined that the first initial data signal is at the second level state, and the second initial data signal is at the first level state when the data signal is a second value.

According to some embodiments, the method may further include the following operation.

A second switch unit 15 is turned on when a second enable signal is in an active state.

Correspondingly, when the second switch unit 15 is turned on, the method may further include the following operations.

When the data signal is the first value, a third transistor is turned on according to the second drive signal, to enable the target transmission signal to be at the first level state.

When the data signal is the second value, a second transistor is turned on according to the first drive signal, to enable the target transmission signal to be at the second level state.

It should be noted that, whether the second transistor T2 and the third transistor T3 operate may be controlled through controlling the second switch unit 15 to be turned on or off by the second enable signal to obtain the target transmission signal.

When the second switch unit 15 is turned on, and the output circuit 123 is in an operating state, after receiving the first drive signal and the second drive signal, the output circuit 123 is configured to determine the target transmission signal in the following mode. The third transistor is turned on based on the second drive signal to obtain the target transmission signal at the first level state if the data signal is the first value; and the second transistor is turned on based on the first drive signal to obtain the target transmission signal at the second level state if the data signal is the second value.

According to some embodiments, the method may further include the following operations.

The target transmission signal is sent to the receiving circuit 14 through the processing circuit 12 after the target transmission signal is obtained.

It should be noted that, after obtaining the target transmission signal, the processing circuit 12 transmits the target transmission signal to the receiving circuit 14. The receiving circuit 14 may include a data pad or a storage unit.

According to some embodiments, the first enable signal and the second enable signal include at least one of a read operation signal, a write operation signal, a row address strobe signal, a column address strobe signal, or an activation operation signal.

It should be noted that, the first enable signal and the second enable signal may be the same or different, which may be configured according to actual circuit requirements.

Details in the embodiments of the disclosure which are not disclosed may be understood with reference to the description of the foregoing embodiments.

The embodiments of the disclosure provide a data transmission method, including the following operations. A first enable signal is received. A first switch unit is turned on to receive an initial data signal when the first enable signal is in an active state. The initial data signal is driven to obtain a target transmission signal. In this way, the initial data signal is received merely when the first enable signal is in the active state, and the initial data signal is processed to obtain the target transmission signal, thereby reducing the leakage current generated by the data transmission circuit and saving power consumption.

Figure 12:
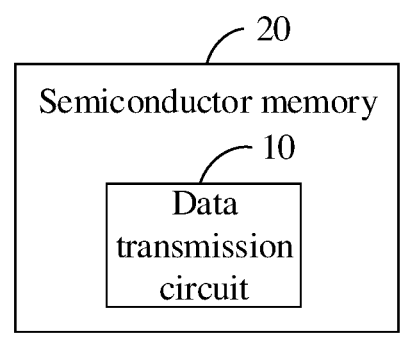
FIG. 12 illustrates a schematic structural diagram of a semiconductor memory according to an embodiment of the disclosure.

Another embodiment of the disclosure provides a semiconductor memory. FIG. 12 illustrates a schematic structural diagram of a semiconductor memory 20 according to the embodiment of the disclosure. As illustrated in FIG. 12, the semiconductor memory 20 may include the data transmission circuit 10 according to any of the foregoing embodiments.

According to some embodiments, the semiconductor memory may be a Dynamic Random Access Memory (DRAM).

The semiconductor memory 20 includes the data transmission circuit 10 according to the foregoing embodiments. Therefore, a control circuit is configured to control a processing circuit to be in an operating state merely when a first enable signal is in an active state, i.e., the processing circuit normally operates merely when the first enable signal is in the active state and does not operate during the remaining time, thereby reducing more leakage current of the semiconductor memory 20 (e.g., DRAM) in a standby mode and further preventing excessive leakage current from damaging the circuit.

The above are merely the preferred embodiments of the present disclosure and are not intended to limit the scope of the present disclosure.

It should be noted that in the present disclosure, terms "include" and "contain" or any other variation thereof are intended to cover nonexclusive inclusions, so that a process, method, object or device including a series of elements not only includes those elements but also includes other elements which are not clearly listed or further includes elements intrinsic to the process, the method, the object or the device. Under the condition of no more limitations, an element defined by the statement "including a/an . . . " does not exclude existence of the same other elements in a process, method, object or device including the element.

The sequence numbers of the embodiments of the disclosure are adopted not to represent superiority-inferiority of the embodiments but only for description.

The methods disclosed in some method embodiments provided in the disclosure may be freely combined without conflicts to obtain new method embodiments.

The features disclosed in some product embodiments provided in the disclosure may be freely combined without conflicts to obtain new product embodiments.

The features disclosed in some method or device embodiments provided in the disclosure may be freely combined without conflicts to obtain new method embodiments or device embodiments.

The above is only the specific implementation of the disclosure and not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subject to the scope of protection of the claims.

The invention claimed is:

1. A data transmission circuit, comprising a control circuit and a processing circuit, wherein:
   the control circuit is configured to receive a first enable signal, control the processing circuit to be in an operating state when the first enable signal is in an active state, and control the processing circuit to be in a non-operating state when the first enable signal is in a non-active state; and
   the processing circuit is configured to receive an initial data signal and drive the initial data signal to obtain a target transmission signal when the processing circuit is in the operating state;
   wherein the initial data signal comprises a first initial data signal and a second initial data signal, and the first initial data signal has an opposite level state to the second initial data signal; and the processing circuit comprises:
   a first processing circuit, configured to drive the first initial data signal to obtain a first drive signal when the processing circuit is in the operating state;
   a second processing circuit, configured to drive the second initial data signal to obtain a second drive signal when the processing circuit is in the operating state; and
   an output circuit, configured to obtain the target transmission signal according to the first drive signal and the second drive signal;
   wherein the first processing circuit comprises N first inverters, wherein an input terminal of a 1st first inverter receives the first initial data signal, an output terminal of an (i)th first inverter is connected to an input terminal of a (i+1)th first inverter, an output terminal of a (N)th first inverter outputs the first drive signal, and enable terminals of the N first inverters are connected to the control circuit, i being an integer greater than 0 and less than N, and N being an even number greater than 0; and
   the second processing circuit comprises M second inverters, wherein an input terminal of a 1st second inverter receives the second initial data signal, an output terminal of a (j)th second inverter is connected to an input terminal of a (j+1)th second inverter, an output terminal of an (M)th second inverter outputs the second drive signal, and enable terminals of the M second inverters are connected to the control circuit, j being an integer greater than 0 and less than M, and M being an even number greater than 0.

2. The data transmission circuit of claim 1, wherein the control circuit comprises a first switch unit,
   wherein the control circuit is configured to control the first switch unit to be turned on when the first enable signal is in the active state, to enable the processing circuit to be in the operating state; and
   the control circuit is further configured to control the first switch unit to be turned off when the first enable signal is in the non-active state, to enable the processing circuit to be in the non-operating state.

3. The data transmission circuit of claim 1, wherein:
   the first enable signal is determined to be in the non-active state when the first enable signal is at a first level state; and
   the first enable signal is determined to be in the active state when the first enable signal is at a second level state.

4. The data transmission circuit of claim 2, wherein the first switch unit comprises a first transistor,
   wherein the first transistor comprises a first terminal, a second terminal, and a third terminal; and
   the first terminal is coupled to the first enable signal, the second terminal is coupled to a power supply terminal or a ground terminal, and the third terminal is coupled to the processing circuit.

5. A data transmission circuit, comprising a control circuit and a processing circuit, wherein:
   the control circuit is configured to receive a first enable signal, control the processing circuit to be in an operating state when the first enable signal is in an active state, and control the processing circuit to be in a non-operating state when the first enable signal is in a non-active state; and
   the processing circuit is configured to receive an initial data signal and drive the initial data signal to obtain a target transmission signal when the processing circuit is in the operating state;
   wherein the initial data signal comprises a first initial data signal and a second initial data signal, and the first initial data signal has an opposite level state to the second initial data signal; and the processing circuit comprises:
   a first processing circuit, configured to drive the first initial data signal to obtain a first drive signal when the processing circuit is in the operating state;
   a second processing circuit, configured to drive the second initial data signal to obtain a second drive signal when the processing circuit is in the operating state; and
   an output circuit, configured to obtain the target transmission signal according to the first drive signal and the second drive signal;
   wherein the output circuit comprises a second transistor and a third transistor, wherein
   a gate terminal of the second transistor is connected to an output terminal of the first processing circuit, a gate terminal of the third transistor is connected to an output terminal of the second processing circuit, one terminal of the second transistor is connected to a power supply terminal, and one terminal of the third transistor is connected to a ground terminal; and
   the other terminal of the second transistor is connected to the other terminal of the third transistor for outputting the target transmission signal.

6. The data transmission circuit of claim 5, wherein the initial data signal is generated according to a data signal obtained by the data transmission circuit when the first enable signal is in the active state,
    wherein the first initial data signal is determined to be at a first level state, and the second initial data signal is determined to be at a second level state when the data signal is a first value; and
    the first initial data signal is determined to be at the second level state, and the second initial data signal is determined to be at the first level state when the data signal is a second value.

7. The data transmission circuit of claim 6, wherein the output circuit further comprises a second switch unit,
    wherein the output circuit is configured to:
    receive a second enable signal, and turn on the second switch unit when the second enable signal is in an active state;
    turn on the third transistor according to the second drive signal when the data signal is the first value, to enable the target transmission signal to be at the first level state, or turn on the second transistor according to the first drive signal when the data signal is the second value, to enable the target transmission signal to be at the second level state.

8. The data transmission circuit of claim 1, wherein the first enable signal and the second enable signal comprise at least one of a read operation signal, a write operation signal, a row address strobe signal, a column address strobe signal, or an activation operation signal.

9. The data transmission circuit of claim 8, further comprising a receiving circuit,
    wherein the processing circuit is further configured to transmit the target transmission signal to the receiving circuit after obtaining the target transmission signal.

10. The data transmission circuit of claim 9, wherein
    the receiving circuit comprises a data pad when the first enable signal comprises the read operation signal; and
    the receiving circuit comprises a storage unit when the first enable signal comprises the write operation signal.

11. A data transmission method, comprising:
    receiving a first enable signal;
    turning on a first switch unit to receive an initial data signal when the first enable signal is in an active state; and
    driving the initial data signal to obtain a target transmission signal;
    wherein the initial data signal is generated according to a data signal obtained by a data transmission circuit when the first enable signal is in the active state, and the method further comprises:
    determining the first initial data signal to be at a first level state, and the second initial data signal to be at a second level state when the data signal is a first value; and
    determining the first initial data signal to be at the second level state, and the second initial data signal to be at the first level state when the data signal is a second value.

12. The method of claim 11, wherein the initial data signal comprises a first initial data signal and a second initial data signal, and the first initial data signal has an opposite level state to the second initial data signal; and
    wherein driving the initial data signal to obtain the target transmission signal comprises:
    driving the first initial data signal through a first processing circuit to obtain a first drive signal;
    driving the second initial data signal through a second processing circuit to obtain a second drive signal; and
    receiving the first drive signal and the second drive signal through an output circuit to output the target transmission signal.

13. The method of claim 11, further comprising:
    turning on a second switch unit when a second enable signal is in an active state,
    wherein when the second switch unit is turned on, the method further comprises:
    turning on a third transistor according to the second drive signal when the data signal is the first value, to enable the target transmission signal to be at the first level state; and
    turning on a second transistor according to the first drive signal when the data signal is the second value, to enable the target transmission signal to be at the second level state.

14. The method of claim 13, wherein the first enable signal and the second enable signal comprise at least one of a read operation signal, a write operation signal, a row address strobe signal, a column address strobe signal, or an activation operation signal.

15. A semiconductor memory, comprising the data transmission circuit of claim 1.

16. The semiconductor memory of claim 15, wherein the semiconductor memory is a Dynamic Random Access Memory (DRAM).

* * * * *